United States Patent [19]
Furukawa et al.

[11] 4,110,746
[45] Aug. 29, 1978

[54] A-D CONVERTER HAVING NONLINEAR CHARACTERISTICS

[75] Inventors: Hikaru Furukawa; Masakazu Mitamura, both of Gyoda; Kenji Higuchi, Ageo, all of Japan

[73] Assignee: Takeda Riken Kogyo Kabushikikaisha, Tokyo, Japan

[21] Appl. No.: 697,897

[22] Filed: Jun. 21, 1976

[30] Foreign Application Priority Data

Jun. 23, 1975 [JP] Japan .................................. 50-77205

[51] Int. Cl.² ........................................... H03K 13/02
[52] U.S. Cl. ......................... 340/347 NT; 73/362 AR; 324/99 D; 340/347 AD; 340/347 M
[58] Field of Search ................. 340/347 AD, 347 NT, 340/347 M; 324/99 D; 235/92 DM, 92 CC, 92 PE, 197; 73/362 AR

[56] References Cited
U.S. PATENT DOCUMENTS

| | | | |
|---|---|---|---|
| 3,662,163 | 5/1972 | Miller et al. | 235/197 |
| 3,824,378 | 7/1974 | Johnson et al. | 235/92 PE |
| 3,824,379 | 7/1974 | Tomisawa et al. | 235/92 PE |
| 3,824,585 | 7/1974 | Meijer | 340/347 NT |
| 3,849,635 | 11/1974 | Freedman | 235/92 PE X |
| 3,863,224 | 1/1975 | Alexander | 235/92 PE X |
| 3,939,459 | 2/1976 | Hoopes | 340/347 NT |
| 4,031,530 | 6/1977 | Aneshansley | 340/347 NT |

*Primary Examiner*—Thomas J. Sloyan
*Attorney, Agent, or Firm*—Pollock, Vande Sande & Priddy

[57] ABSTRACT

Disclosed is an A-D converter in which a voltage to be measured is subjected to first integration for a certain period of time; a reference voltage of the opposite polarity from the voltage to be measured is subjected to second integration until the integrated value obtained by the first integration returns to a predetermined value; measuring clock pulses are counted by a counter circuit in the period of the second integration; and the voltage to be measured is converted by the count value of the counter circuit into a digital value. In the A-D converter, there are provided a variable frequency divider and a memory having stored therein frequency dividing ratio determining signals for changing the frequency dividing ratio of the variable frequency divider. In the period of the second integration, the measuring clock pulses are supplied to the counter circuit through the variable frequency divider and each time the clock pulse is obtained, the frequency dividing ratio determining signals are each detected from the memory and preset in the variable frequency divider. And each time the number of clock pulses supplied to the counter circuit exceeds a certain number, the address of the memory is stepped by one. As a result of this, the frequency dividing ratio of the variable frequency divider sequentially changes, by which is obtained a digital converted value conforming to a non-linear characteristic of the voltage to be measured.

5 Claims, 5 Drawing Figures

FIG. 2 — output of integrator 4

FIG. 3 — open / close

A-D CONVERTER HAVING NONLINEAR CHARACTERISTICS

BACKGROUND OF THE INVENTION

This invention relates to an A-D converter by which an analog quantity having a non-linear characteristic such, for example, as an output voltage with respect to a temperature of a thermocouple is converted into a digital quantity.

A dual slope system is usually employed for converting a voltage to be measured into a digital value. In the dual slope system, the voltage to be measured is subjected to first integration by an integrator for a certain period of time and a reference voltage of the opposite polarity from the voltage to be measured is integrated until the integrated value obtained in the integrator in the period of the first integration returns to a predetermined value, for example, to zero. In the period of the second integration, a gate circuit is opened, through which clock pulses are supplied to a counter and, by counting the number of clock pulses fed to the counter in the period of the second integration, a digital value corresponding to the voltage to be measured is obtained.

In the case of an A-D conversion of the output voltage of a thermocouple by the employment of the dual slope system for the purpose of a digital indication of the temperature of the thermocouple, since the relation between the temperature and output voltage of the thermocouple has a non-linear characteristic, it is necessary that an A-D converter of the dual slope system has a non-linear characteristic conforming to the above-said characteristic.

A method that has heretofore been employed to provide the A-D converter with such a non-linear characteristic is to change the integration time constant of the integrator each time the integrated voltage of the integrator varies a certain quantity in the period of the second integration. With this method, resistors are connected in series between the integrator and a reference power source for providing an integration time constant during the second integration and the resistance values of the resistors are successively changed as the second integration proceeds, by which the integration time constant of the integrator is changed to provide a non-linear relationship between an input voltage and its converted value.

With this method, however, the resistors for defining the time constant are required to be highly stable, which inevitably increases the cost of the A-D converter. Further, it is necessary to use resistors having desired resistance values, so that their adjustment is very troublesome. Moreover, in the case where thermocouples of different non-linear temperature vs. output voltage characteristics are coupled to measuring terminals, the integration time constant is required to be changed in accordance with the individual non-linear characteristics, so that a certain combination of resistors must be provided. Accordingly, an increase in the number of kinds of thermocouples used increases the cost of the A-D converter.

An object of this invention is to provide a non-linear A-D converter which is free from a change resulting from aging, and hence excellent in stability.

Another object of this invention is to provide a non-linear A-D converter which can be obtained at a lost cost regardless of an increase in the number of kinds of transducers of different non-linear characteristics measurable with the converter.

Still another object of this invention is to provide a non-linear A-D converter which is inexpensive but highly accurate.

SUMMARY OF THE INVENTION

This invention is premised on a dual slope type A-D converter in which a voltage to be measured is subjected to first integration by an integrator for a certain period of time, a source of a reference voltage opposite in polarity to the voltage to be measured is connected to the input side of the integrator after the first integration and the reference voltage from the reference voltage source is subjected to second integration by the integrator until the integrated voltage of the integrator returns to its initial value. In the period of the second integration, measuring clock pulses are measured by a counter circuit and by the resulting count value, the voltage to be measured is converted into a digital value. The A-D converter has a variable frequency converter and a memory having stored therein signals for determining the frequency dividing ratio of the variable frequency divider. In the period of the integration, the measuring clock pulses are supplied to the counter circuit through the variable frequency divider and each time the measuring clock pulses are each obtained, the frequency dividing ratio determining signals are each read out of the memory and preset in the variable frequency divider. At the same time, the measuring pulses are supplied to an address counter and each time the number of measuring clock pulses counted by the address counter reaches a predetermined value, an address of the memory to be read out is stepped by one step to change the frequency dividing ratio determining signal to the frequency divider, whereby the frequency dividing ratio of the frequency divider is changed. Accordingly, the pulse interval of the measuring clock pulses supplied to the counter is also successively altered. With the change in the pulse intervals of the clock pulses at every predetermined number of them, the A-D conversion characteristic is made non-linear in the form of a broken line. By a suitable selection of the preset signals of the memory, the pulse interval of the clock pulses is set at an appropriate value, enabling an A-D conversion which is approximate to a desired non-linear characteristic.

BRIEF DESCRIPTION OF THE DRAWINGS

FIG. 1 is a connection diagram illustrating one embodiment of an A-D converter according to this invention;

FIGS. 2 to 4, inclusive, are waveform diagrams for explaining the operation of the embodiment shown in FIG. 1.

DESCRIPTION OF THE PREFERRED EMBODIMENTS

Figures 1, 4:
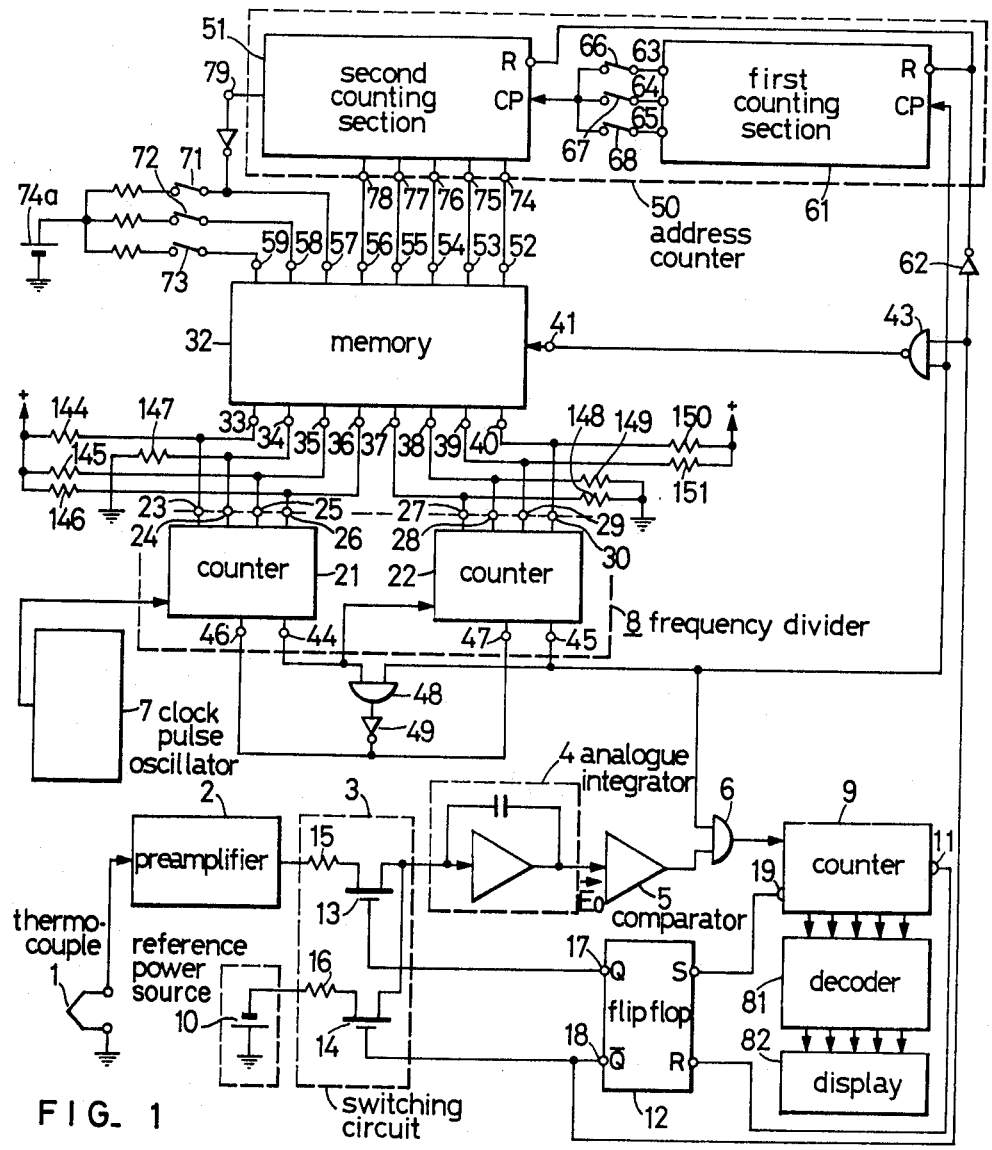

FIG. 1 shows one embodiment of a non-linear A-D converter of this invention as being applied to a thermoelectric thermometer. In FIG. 1, reference numeral 1 indicates a thermocouple. An output voltage of the thermocouple 1 is supplied to an analog integrator 4 through a switching circuit 3, if necessary, after being amplified by a preamplifier 2. An integrated voltage $E_0$ (FIG. 2) of the integrator 4 is supplied to a comparator 5, which detects the integrated output $E_0$ having exceeded a predetermined value, for example, $E_1$ as shown in FIG. 2 and, in such a case, an output from the comparator 5 becomes "1" logic and an AND gate circuit 6 is controlled to open as depicted in FIG. 3. Where the integrated voltage of the integrator 4 becomes lower than the predetermined value $E_1$, the output from the comparator 5 becomes "0" logic and the AND gate 6 is controlled to close. In the state that the AND gate circuit 6 is controlled to open, output pulses 111 (FIG. 4) from a clock pulse oscillator 7 are supplied to a counter 9 through a frequency divider 8. When the counted value by the counter 9 has reached a predetermined value, that is, when the counter 9 has counted, for example, 2000 clock pulses 111, an output signal is derived from an output terminal 11 of the counter 9 and applied to a flip-flop circuit 12 to invert it. As a result of this, the switching circuit 3 is controlled by an output signal from the flip-flop circuit 12. The time interval in which the count content of the counter 9 reaches the predetermined value after the AND gate circuit 6 has been opened, will hereinafter be referred to as a first integration period, which is identified as $T_1$ in FIG. 2.

When the switching circuit 3 is controlled to be changed over, a reference voltage of a reference power source 10, which is opposite in polarity to the output from the preamplifier 2, is supplied to the integrator 4 to select a second integration mode of operation. A period $T_2$ shown in FIG. 2 is a second integration period. When the first integration mode of operation is switched to the second one, the output signal from the flip-flop circuit 12 is supplied not only to the switching circuit 3 to control it but also to a read control terminal 41 of a memory 32 through a NAND circuit 43, thereby to provide such a state that signals for determining the frequency dividing ratio of the frequency divider 8 stored in the memory 32 can be read out at output terminals 33, 34, 35, 36 and 37, 38, 39, 40. Accordingly, the frequency dividing ratio of the frequency divider 8 is changed by the frequency dividing ratio determining signals read out of the memory 32 and, in the second integration mode of operation, the frequency divider 8 serves as a variable frequency divider. In the second integration mode of operation, the output pulses from the frequency divider 8 are counted by the counter 9 and, by this counted value, a converted digital value is obtained. At the same time, the output pulses from the frequency divider 8 are further supplied to a first counting section 61, by which a second counting section 51 is driven step by step each time the output pulses from the frequency divider 8 reach a certain value to update address of the memory 32 to change the frequency dividing ratio determining signals read out at the read output terminals 33, 34, 35, 36 and 37, 38, 39, 40, thereby changing the frequency dividing ratio of the frequency divider 8. When the frequency dividing ratio of the frequency divider 8 is changed, the number of measuring pulses supplied in a unit time from the frequency divider 8 to the counter 9 through the AND gate circuit 6 varies as indicated by pulse groups 112, 113 and 114 in FIG. 4, by which the A-D conversion characteristic is made non-linear.

A detailed description will be given in connection with the construction and operation of each part of the above embodiment.

The flip-flop circuit 12 is supplied at its set input terminal with an output signal from an initial code output terminal 19 of the counter 9. When the counted value of the counter 9 is zero, the flip-flop circuit 12 is held in its set state and its output terminals 17 and 18 are maintained at the "1" and "0" logic, respectively. When the counted value of the counter 9 has reached a predetermined value, for example, "2000", the counter 9 derives at its output terminal 11 an output, which is supplied to a reset terminal of the flip-flop circuit 12 to invert the flip-flop circuit 12, providing outputs of the "0" and "1" logic at the output terminals 17 and 18, respectively. By the outputs at the output terminals 17 and 18, the switching circuit 3 and the memory 32 are controlled to select the first and second integration modes of operation.

The switching circuit 3 can be formed with switching elements 13 and 14 such, for example, as field effect transistors. The switching element 13 is connected in series between the output terminal of the preamplifier 2 and the input terminal of the integrator 4 through a resistor 15 in such a manner as to provide an intermittent control of the measured voltage signal which is supplied from the preamplifier to the integrator 4. The switching element 14 is connected in series between the reference power source 10 and the input terminal of the integrator 4 through a resistor 16 so that the reference voltage from the reference power source 10 to the integrator 4 is intermittently controlled. The outputs at the output terminals 17 and 18 of the flip-flop circuit 12 are respectively supplied to control electrodes of the switching elements 13 and 14, by which when the output at the output terminal 17 is of the "1" logic, the switching element 13 is turned on to supply the output from the preamplifier 2 to the integrator 4, thereby retaining the first integration mode of operation. On the other hand, when the output at the output terminal 18 is the "1" logic, the switching element 13 is turned off and the switching element 14 is turned on to supply the reference voltage of the reference power source 10 to the input terminal of the integrator 4, by which the first integration mode of operation is switched to the second one. The resistors 15 and 16 mentioned above are to provide different integration time constants of the integrator 4 in the first and second integration modes of operation. Generally, the second integration time constant is selected larger than the first one and they bear a relationship, for example, of an integral multiple, so that the second integration period $T_2$ may be longer than the first one $T_1$. With such a relationship of an integral multiple between the first and second integration periods $T_1$ and $T_2$, it is possible to provide for enhanced accuracy and resolution of the A-D conversion characteristic.

Next, a description will be made of the constructions of the frequency divider 8 and the memory circuit 32 provided for changing the frequency dividing ratio of the frequency divider 8. The frequency divider 8 can be formed with an IC element such, for example, as is commercially known under the name of 74LS193. This element is usually employed as a preset counter and one element can be actuated as a counter of 16 steps at maximum. In the above example, two elements 21 and 22 are connected in cascade and arranged to serve as a counter of 256 steps at maximum. That is, these two elements respectively have preset terminals 23, 24, 25, 26 and 27, 28, 29, 30 and when these preset terminals 23 to 26 and 27 to 30 are supplied with preset signals "0,0,0,0,0,0,0,0" respectively weighted with 1, 2, 4, 8, 16, 32, 64 and 128, the abovesaid two elements operate as a 256-step counter. Accordingly, when supplied at the input terminal with the clock pulse from the clock pulse oscillator 7, the element 21 derives at its output terminal a clock pulse frequency divided to 1/16. This output pulse is further frequency divided by the element 22 to 1/16, providing a clock pulse frequency divided to 1/256 as a whole.

The preset terminals 23 to 26 and 27 to 30 of the elements 21 and 22 have connected thereto resistors 144 to 147 and 148 to 151, respectively, through which are applied the preset signals for deciding the frequency dividing ratio in the first integration mode of operation. In the present example, the frequency dividing ratio during the first integration is selected to be 1/50. Accordingly, the preset terminals 23 to 26 and 27 to 30 of the elements 21 and 22 are respectively supplied with preset signals "1,0,1,1,0,0,1,1" by the resistors 144, 145, 146, 147 and 148, 149, 150, 151. To perform this, the resistors 144, 145, 146 and 150, 151 are connected at one end to the preset terminals 23, 25, 26 and 29, 30 and at the other end to positive power sources, respectively, by which the preset terminals 23, 25, 26 and 29, 30 are each given the "1" logic. Further, the resistors 147, 148 and 149 connected at one end to the preset terminals 24 and 27, 28 are grounded at the other end, providing the "0" logic at the preset terminals 24, 27 and 28. By the application of the preset signals "1,0,1,1,0,0,1,1" to the preset terminals 23 to 26 and 27 to 30 of the elements 21 and 22 in the manner described above, the frequency divider 8 functions as a 1/50 frequency divider and, at every application thereto of 50 clock pulses from the clock pulse oscillator 7, an output of the "1" logic is derived at an output terminal 45 of the element 22, which output is supplied to the counter 9 through the AND gate circuit 6. Consequently, during the first integration, when the oscillation frequency of the clock pulse oscillator 7 is 1MHz, the counter 9 is supplied with the clock pulse 111 of 20KHz shown in FIG. 4. As a result of this, the time in which the counter 9 counts 2000 clock pulses, that is, the first integration period $T_1$, is defined to be 0.1 sec.

On the other hand, the elements 21 and 22 respectively have preset instruction terminals 46 and 47. By the application of the "1" logic to the terminals 46 and 47, the preset signals supplied to the preset terminals 23 to 26 and 27 to 30 are preset in the frequency divider 8. Consequently, upon application of the fiftieth clock pulse from the clock pulse oscillator 7, the elements 21 and 22 both derive at their output terminals 44 and 45 outputs of the "1" logic. These outputs are supplied to a NAND gate circuit 48, the output of which is supplied to the preset instruction terminals 46 and 47 through an inverter 49. Accordingly, only when both of output terminals 44 and 45 become of the "1" logic, the preset instruction terminals 46 and 47 are given the "1" logic, by which the preset signals set by the resistors 144 to 147 and 148 to 151 are preset in the frequency divider 8, which serves as a 1/50 frequency divider.

The memory 32 can be formed, for example, with a read-only memory called UPD463D or 1702A. The read-only memory 32 has a read control terminal 41 and output terminals 33, 34, 35, 36, 37, 38, 39 and 40 for reading 8 bits. The read output terminals 33 to 40 are respectively connected to the preset terminals 23 to 30 of the elements 21 and 22. While the read control terminal 41 is given the "1" logic, switching elements, which are connected in series between the read output terminals 33 to 40 and internal circuits of the memory 32, are held in their off state. Accordingly, in such a state, the preset signals set by the resistors 144 to 151 are supplied to the preset terminals 23 to 30 of the elements 21 and 22. Upon application of the "0" logic to the read control terminal 41, the abovesaid switching elements between the read output terminals 33 to 40 and the internal circuits of the memory are turned on to produce read outputs at the read output terminals 33 to 40. At this time, the outputs read out of the memory 32 are respectively applied to the preset terminals 23 to 30 of the elements 21 and 22 making up the frequency divider 8 regardless of the preset signals set by the resistors 144 to 151. And the frequency dividing ratio is determined dependent upon the abovesaid read outputs.

It is arranged that the read control signal supplied to the read control terminal 41 is obtained under the control of the output at the output terminal 18 of the flip-flop circuit 12 and the output signal at the output terminal 45 of the frequency divider 8 through a NAND gate circuit 43. With such an arrangement, in the first integration period, the "0" logic is applied to one input terminal of the NAND gate circuit 43 from the flip-flop circuit 12, so that the output from the NAND gate circuit 43 is held in the "1" logic regardless of the logic at the other input terminal. Accordingly, in the first integration period, the read control terminal 41 is retained in the "1" logic and no read outputs appear at the output terminals 33 to 40. On the other hand, in the second integration period, one input terminal of the NAND gate circuit 43 is supplied with the "1" logic from the flip-flop circuit 12. Accordingly, each time the output terminal 45 of the frequency divider 8 is given the "1" logic, the input terminals of the NAND gate circuit 43 both becomes of "1" logic, so that the read control terminal 41 is given the "0" logic. Therefore, each time the clock pulses are derived from the frequency divider 8, read signals are derived at the output terminals 33 to 40 of the memory 32 and these read signals are applied to the preset terminals 23 to 30 of the frequency divider 8 and preset therein. In the case where the read signals derived at the output terminals 33 to 40 are, for example, "1,1,0,1,1,0,0,1", the frequency dividing ratio of the frequency divider 8 is set to be 1/100. Further, when the read signals are changed, for example, to "0,1,0,1,1,0,0,1" due to changes in read addresses, the frequency dividing ratio of the frequency divider 8 is set to be 1/101 and when the read signals are further changed to "1,0,0,1,1,0,0,1", the frequency dividing ratio is set to be 1/102. In this manner, the frequency dividing ratio of the frequency divider 8 is altered.

The read addresses of the memory 32 are designated by address signals which are supplied to address input terminals 52, 53, 54, 55, 56, 57, 58 and 59 from an address counter 50. The address counter 50 comprises first and second counting sections 61 and 51. The first counting section 61 is supplied with the output pulses from the frequency divider 8 and applies an output to the second counting section 51 each time it counts a predetermined number of frequency divided output pulses from the frequency divider 8. And by count values obtained at count output terminals 74 to 79 of the second counting section 51, the address of the memory 32 is changed. Reset terminals R of the first and second counting sections 61 and 51 are supplied with first and second integration mode switching signals from the output terminal 18 of the flip-flop circuit 12 through an inverter 62. In the first integration period $T_1$, reset signals of "1" logic are supplied to the reset terminals of the first and second counting sections 61 and 51 to prevent the operations of both sections. Upon switching of the first integration mode of operation to the second one, the signals applied to the reset terminals of the first and second counting sections 61 and 51 are changed to the "0" logic to remove the operation preventing state. The first counting section 61 is designed so that the count value can be changed. That is, it has three output terminals 63, 64 and 65 and is adapted to derive at the output terminal 63 outputs frequency divided, for example, to 1/32, 1/64 and 1/128 of the frequency of the input clock pulses, respectively. There frequency divided outputs obtained at the output terminals 63, 64 and 65 are respectively selected by switches 66, 67 and 68 and supplied to the input terminal CP of the second counting section. The selection of the switches 66, 67 and 68 is dependent upon the characteristic of the thermocouple 1. That is, thermocouples have such a property that their temperature vs. output voltage curves have different slopes according to the kinds of the thermocouples. In the case where the slope of the temperature vs. output voltage curve greatly changes, an accurate broken-line approximation of such a curve requires an increase in the number of times of reading the memory 32 in connection with a temperature change. Thermocouples of the type wherein the slope of the temperature vs. output voltage curve changes relatively greatly, are IC (iron-constantan), CA (chromel-Alumel), PR (platinum platinum-rhodium), CRC (chromel-constantan) and like ones. In the case of an A-D conversion of their output voltage, the switch 66 is turned on to supply the 1/32 frequency divided output from the first counting section 61 to the second counting section 51. In the case of measuring temperatures below 0° with a CC (copper-constantan) thermocouple, since the slope of the temperature vs. output voltage curve does not greatly change, the switch 67 is turned on to supply the 1/64 frequency divided output from the first counting section 61 to the second one 51. Further, in the case of measuring temperatures above 0° similarly with the CC (copper-constantan), since the change of the slope of the temperature vs. output voltage curve is smaller than that in the above case, the switch 68 is turned on to supply the 1/128 frequency divided output from the first counting section 61 to the second one 51. Accordingly, in the case of an A-D conversion of the output voltage of, for example, the iron-constantan thermocouple, each time 32 pulses are derived from the frequency divider 8, the output from the second counting section 51 advances step by step to update the address of the memory 32, thus changing the frequency dividing ratio of the frequency divider 8.

Address input terminals 57, 58 and 59 of the memory 32 for higher order digits are connected, for example, to a "1" logic signal source 74a through selection switches 71, 72 and 73, respectively, so that base address selection signals can be supplied to the above address input terminals 57, 58 and 59. When the switches 71, 72 and 73 are turned on, the "1" logic is supplied to each of the address input terminals 57, 58 and 59 and when the switches are turned off, the "0" logic is supplied to the terminals. Accordingly, in the present example, one of memory areas of the memory 32 in which frequency dividing ratio determining signals for the non-linear correction, for instance, of six kinds of thermocouples are stored in a sequential order, can be selected by the combination of the on-off operations of the switches 71, 72 and 73. For example, in the case of "0,0,0" being set in the order of the address input terminals 59, 58 and 57, a memory area for the measurement of temperatures above 0° C. by the copper-constantan thermocouple is selected; in the case of "0,0,1", a memory area for the measurement of temperatures below 0° C. by the copper-constantan thermocouple is selected; in the case of "0,1,0", a memory area for the chromel-constantan thermocouple is selected; in the case of "0,1,1", a memory area for the iron-constantan thermocouple is selected; and in the case of "1,0,0", a memory area necessary for the measurement from 0° to 1024° C. by the Chromel-Alumel thermocouple is selected. In the case of temperature measurements above 1025° C., a carry signal is applied from the output terminal 79 of the second counting section 51 to the address input terminal 57 of memory 32 to change the inputs to the address input terminals 59, 58 and 57 to "1,0,1", by which is selected a memory area necessary for the measurement above 1025° C. Further, in the case of "1,1,0", a memory area necessary for the measurement of 0° to 1024° C. by the platinum platinum-rhodium thermocouple is selected and in the case of measurements above 1025° C., a carry signal is supplied to the address input terminal 57 from the output terminal 79 of the address counter 50 to change the inputs to the address input terminals 59, 58 and 57 to "1,1,1", by which is selected a memory area necessary for the measurement above 1025° C.

In this manner, in the second integration period $T_2$, the frequency dividing ratio of the frequency divider 8 is successively changed by the read output from the memory 32. And the interval of the measured clock pulses, which are supplied to the counter 9, varies following the frequency dividing ratio determining signals stored in the memory 32, achieving an A-D conversion based on a predetermined non-linear characteristic. When the integrated voltage $E_O$ of the integrator 4 becomes lower than the reference voltage $E_1$, the AND gate circuit 6 is closed to stop the supply of the measured pulses to the counter 9 and, at this time, the count value of the counter 9 is supplied through a decoder 81 to a display 82 to provide thereon an indication of a measured temperature.

As described above, in accordance with this invention, the frequency dividing ratio of the frequency divider 8 in the first integration period is initially set by designating one of the kinds of thermocouples stored in the memory 32. Each time the output pulses from the frequency divider 8 reaches a certain value, the read address of the memory 32 is changed and the preset value of the frequency divider 8 is altered with the change in the read address, by which the frequency dividing ratio of the frequency divider 8 is successively changed. After all, the degree of change of the frequency dividing ratio corresponds to the non-linear characteristic of the thermocouple used and once the non-linear characteristic of the thermocouple has been encoded into a binary code, the memory 32 can be mass-produced as integrated circuit elements. In addition, with this invention, the frequency dividing ratio of the frequency divider 8 is selectively changed in accordance with the values stored in the memory 32 to change the pulse interval of the clock pulses supplied to the counter 9, so that the A-D conversion does not produce any conversion error due to aging of the circuit elements or the like and remains stable as long as the voltage of the reference power source 10 is stable. Further, even if the number of kinds of thermocouples to be measured is increased, since a read-only memory of large memory capacity is available at a relatively low cost, it is possible to produce inexpensively an A-D converter which is capable of converting many kinds of analog quantities of different non-linear characteristics into digital quantities. Moreover, once a memory having stored therein various kinds of non-linear characteristics has been obtained, the A-D converter can be produced with substantially no adjustment, and hence is easy to produce. Furthermore, in the first integration period $T_1$, the frequency divider 8 is used as a fixed frequency divider and the clock pulses of the clock pulse oscillator 7 supplied to the counter 9 are lowered in frequency to a predetermined value, so that the first integration period $T_1$ can be made relatively long. Since this enables the integrator 4 to integrate the measured voltage to a high level, the second integration period $T_2$ can be made long without selecting a large ratio between the integration time constants in the first and second integration periods. Thus, the A-D conversion can be achieved with high accuracy.

In other words, it is also considered possible to switch the first integration mode of operation to the second one when the count value of the counter 9 supplied with the output pulses from the clock pulse oscillator 7 through the AND gate circuit 6 has reached a predetermined value but a crystal oscillator is usually employed as the clock pulse oscillator 7 because it is required to be stable, so that its oscillation frequency is set relatively high. It is believed that an oscillation in a frequency range of about 1 to 3MHz provides a highly stable oscillation output. Accordingly, in the case of an oscillation at a lower frequency, for example, 1MHz, if the first integration period $T_1$ is set to be, for example, 0.1 sec., the counter 9 is required to count $100 \times 10^3$ pulses. As a result of this, it is necessary to employ, as the counter 9, a 6-digit counter, which is uneconomical because the temperature indication is provided with four digits. In the case of counting the clock pulses of 1MHz with the 4-digit counter, the longest possible time obtainable is the period in which the count value of the counter reaches "9999", that is, 9999 $\mu$sec., with result that the first integration period $T_1$ is made short. Where the first integration period $T_1$ is short, the integrated voltage of the analog integrator 4 becomes smaller. In order to make the second integration period $T_2$ long, it is necessary to use a large integration constant in the second integration period $T_2$. However, an increase in the integration time constant of the second integration results in a weak integrated current, which is susceptible to the influences of a drift, an offset voltage and a current of an operational amplifier forming the integrator 4, producing a large measurement error.

Accordingly, in the first integration period $T_1$, the oscillation frequency of the clock pulse oscillator 7 is frequency divided to obtain clock pulses of an appropriate frequency and the clock pulses are counted by the counter 9, by which the first integration period of a sufficiently large integration time constant can be defined. In addition, since the frequency divider 8 is operated as a fixed frequency divider in the first integration period $T_1$ and as a variable frequency divider in the second integration period $T_2$, this invention requires less circuit elements than those in the case of providing a fixed and a variable frequency divider individually, and hence is economical. However, where a fixed frequency divider can be obtained at a low cost by the employment of an IC element, the frequency divider 8 need not always be employed to perform the functions of the fixed and variable frequency dividers and a fixed frequency divider actuable only in the first integration period may also be provided separately.

Figure 5:
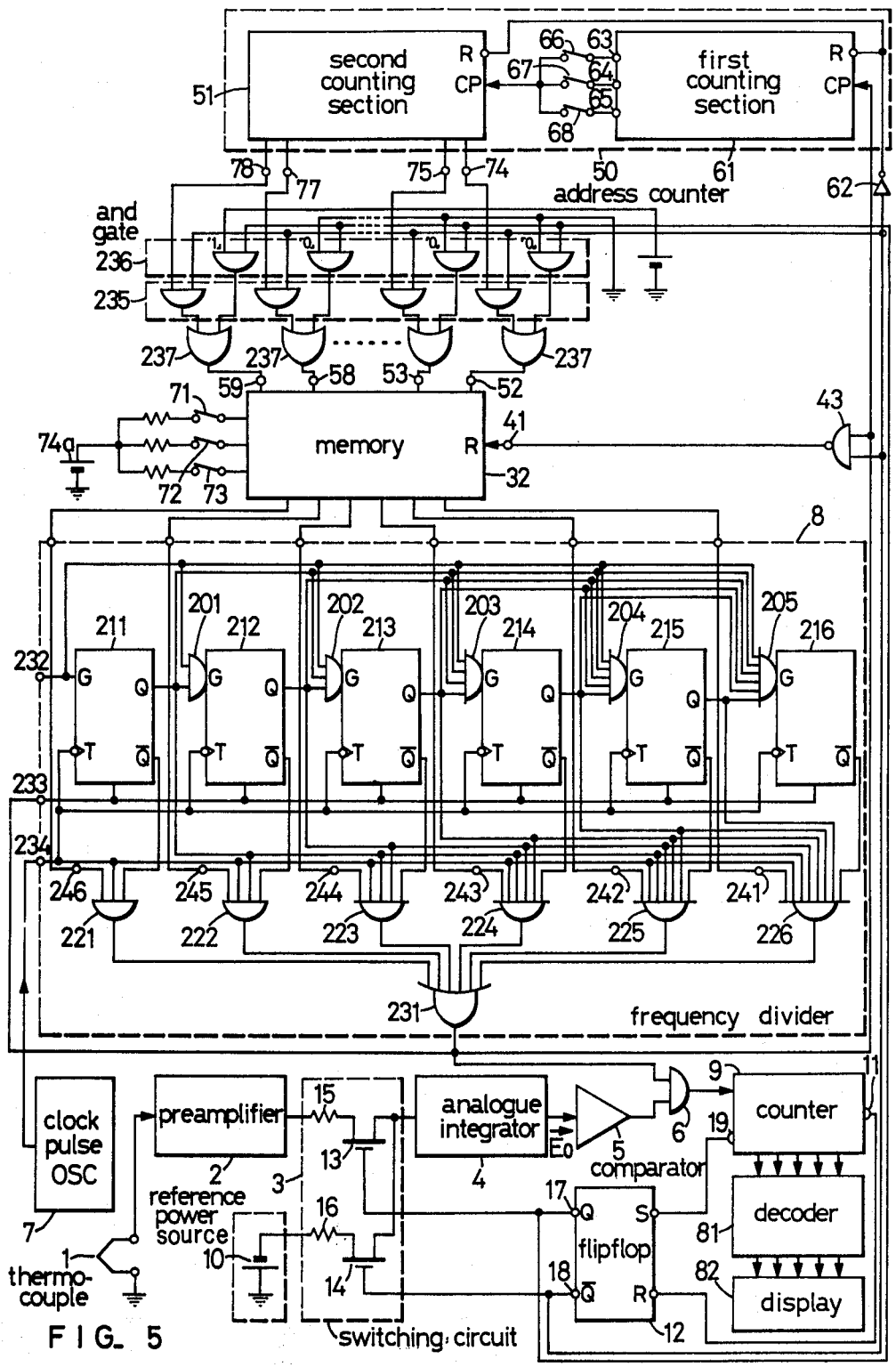
FIG. 5 is a connection diagram showing another embodiment of the A-D converter of this invention.

In the foregoing, a preset counter is employed as the frequency divider 8 but some other type of frequency divider can also be used. For example, it is possible to employ a frequency divider called a rate multiplier, as shown in FIG. 5. In this example, the rate multiplier comprises, for instance, GT flip-flop circuits 211 to 216 of cascade connection through AND gate circuits 201 to 205, AND gate circuits 221 to 226 for obtaining the logical products of the outputs read out of the memory 32, the clock pulses of the clock pulse oscillator 7 and the outputs from the flip-flop circuits 211 to 216, and an OR gate circuit 231 for obtaining the logical sum of the outputs from the AND gate circuits 221 to 226. That is, an input terminal 232 is always given the "1" logic and this "1" logic input is supplied to the first-stage flip-flop circuit 211 directly at its G input terminal and to G input terminals of the other flip-flop circuits 212 to 216 through the AND gate circuits 201 to 205. The AND gate circuit 201 supplies the G input terminal of the flip-flop circuit 212 of the next stage with the logical output of the "1" logic input applied to the input terminal 232 and the output from the flip-flop circuit 211. The AND gate circuit 202 supplies the G input terminal of the flip-flop circuit 213 with the logical product of the "1" logic input of the input terminal 232 and each of the outputs from the flip-flop circuits 211 and 212. The AND gate circuit 203 supplies the G input terminal of the flip-flop circuit 214 with the logical product of the "1" logic input of the input terminal 232 and each of the outputs from the flip-flop circuits 211, 212 and 213. The AND gate circuit 204 supplies the G input terminal of the flip-flop circuit 215 with the logical product of the "1" logic input of the input terminal 232 and each of the outputs from the flip-flop circuits 211, 212, 213 and 214. The AND gate circuit 205 supplies the G input terminal of the flip-flop circuit 216 with the logical product of the "1" logic input of the input terminal 232 and each of the outputs from the flip-flop circuits 211, 212, 213, 214 and 215. To an input terminal 233 is applied the output from the frequency divider 8, that is, the output from the OR gate circuit 231 and each time the OR gate circuit 231 derives therefrom an output pulse, reset signals are thus supplied to the flip-flop circuits 211 to 216. To an input terminal 234, the clock pulses from the clock pulse oscillator 7 are applied and the clock pulses are supplied to T input terminals of the flip-flop circuits 211 to 216. The AND gate circuit 221 is adapted to obtain a logical product of a read output of the least significant digit of the memory 32, the clock pulse from the clock pulse oscillator 7 and an inverted output from the flip-flop circuit 211. The AND gate circuit 222 is adapted to obtain a logical product of a read output of a second digit of the memory 32, the clock pulse from the clock pulse oscillator 7, the positive output from the flip-flop circuit 211 and the inverted output from the flip-flop circuit 212. The AND gate circuit 223 is adapted to obtain a logical product of a read output of a third digit of the memory 32, the clock pulse from the clock pulse oscillator 7, the positive outputs from the flip-flop circuits 211 and 212 and the inverted output from the flip-flop circuit 213. The AND gate circuit 224 is adapted to obtain a logical product of a read output of a fourth digit of the memory 32, the clock pulse from the clock pulse oscillator 7, the positive outputs from the flip-flop circuits 211, 212 and 213 and the inverted output from the flip-flop circuit 214. The AND gate circuit 225 is adapted to obtain a logical product of a read output of a fifth digit of the memory 32, the clock pulse from the clock pulse oscillator 7, the positive outputs from the flip-flop circuits 211, 212, 213 and 224 and the inverted output from the flip-flop circuit 215. The AND gate circuit 226 is adapted to obtain a logical product of a read output of the most significant digit of the memory 32, the clock pulse from the clock pulse oscillator 7, the positive outputs from the flip-flop circuits 211, 212, 213, 214 and 215 and the inverted output from the flip-flop circuit 216. The outputs from the AND gate circuits 221 to 226 are applied to the OR gate circuit 231 to derive therefrom an output, which is used as the frequency divided output from the frequency divider 8. This output is supplied to the counter 9 through the AND gate circuit 6 and to the first counting section 61 of the address counter 50. The count outputs of different frequency dividing ratios obtained at the output terminals 63, 64 and 65 of the first counting section 61 are selected by the switches 66, 67 and 68 and, by the selected output, the second counting section 51 is driven to produce address signals at its output terminals 74 to 79, by which the read address of the memory 32 is changed. AND gate circuit groups 235 and 236 are provided respectively between the output terminals 74 to 79 of the second counting section 51 and the address designating terminals 52 to 59 of the memory 32. In the first integration period $T_1$, the AND gate circuit group 236 is controlled to open, through which predetermined fixed address signals are supplied to the memory 32 to read out therefrom frequency dividing ratio determining signals for determining a predetermined fixed frequency dividing ratio required in the first integration period $T_1$. In the second integration period $T_2$, the AND gate circuit group 236 is closed and the other AND gate circuit group 235 is opened, through which address signals are supplied to the memory 32 from the counter 50. Accordingly, the output signal at the output terminal 18 of the flip-flop circuit 12 is supplied to one input terminal of each AND gate circuit of the AND gate circuit group 235 to hold the circuits of this group in their closed state during the first integration and in their open state during the second integration. At this time, the output from the address counter 50 is supplied to the memory 32. Further, the output signal at the output terminal 17 of the flip-flop circuit 12 is supplied to one input terminal of each AND gate circuit of the AND gate circuit group 236 to open the AND gate circuit group 236 in the first integration period and fixed address signals, for example, "1,0, . . . 0,0", supplied to the other input terminals of the AND gate circuits of the AND gate circuit group 236, are applied to the memory 32 through OR gate circuits 237, respectively.

As described above, in the embodiment of FIG. 5, too, the frequency divider 8 can be actuated as a fixed frequency divider in the first integration period $T_1$ and as a variable frequency divider in accordance with the address signal from the address counter 50 in the second integration period $T_2$.

Namely, in the case where the frequency divider 8 is constructed as described above, a preset signal is supplied to each of input terminals 241 to 246 of the AND gate circuits 221 to 226 from each output terminal of the memory 32. The frequency dividing ratio (F out)/(F in) of the variable frequency divider is M/64, where M can be expressed by $M = A\cdot 2 + B\cdot 2^1 + C\cdot 2^2 + D\cdot 2^3 + E\cdot 2^4 + F\cdot 2^5$, A to F being preset logical values, for example, at the terminals 241 to 246. Accordingly, assuming that, for example, only the terminal 246 is given the "1" logic and that the other terminals 241 to 245 are given the "0" logic, $M = 2^5$, so that (F out)/(F in) = 32/64 = 1/2 and, at the output of the OR gate circuit 231, pulses of a frequency 1/2 that of input clock pulses are obtained. Further, if the terminals 241 and 244 are given the "1" logic and if the other terminals 242, 243, 245 and 246 are given the "0" logic, it follows that $$(F\ out)/(F\ in) = (2^0 + 2^3)/64 = 17/64 = 0.2656.$$

Thus, the frequency dividing ratio is varied in accordance with the contents stored in the memory 32 and the frequency of the pulses supplied to the counter 9 in the second integration period is successively changed in accordance with the contents stored in the memory 32. Therefore, the second integration period $T_2$ and the count value of the counter 9 can be made to bear a nonlinear relationship as is the case with the embodiment described in connection with FIG. 1.

Although this invention has been described with regard to the case of a thermocouple being used as the transducer, the invention is also applicable to the cases of other transducers producing outputs of nonlinear characteristics or the case of an A-D conversion of an output from a converter. Further, the memory 32 is not limited specifically to the read-only memory but may be of some other type.

It will be apparent that many modifications and variations may be effected without departing from the scope of the novel concepts of this invention.

What is claimed is:

1. An A-D converter response to an input voltage comprising:
   integrating means;
   a source of input voltage;
   a source of a reference signal opposite in polarity to the input voltage;
   a reference clock pulse source;
   a counter;
   a control logical circuit controlled by the output from the counter to supply the input voltage to the integrating means so that it achieves a first integration until the count value of the counter reaches a preset value from a predetermined one whereafter the integrating means then achieves second integration of the reference signal;
   a variable frequency divider circuit for frequency dividing the clock pulses from the reference clock pulse source and connected to supply the frequency divided pulses to the counter during the periods of said first and second integrations;
   an address counter for counting the frequency divided pulses from the frequency divider circuit;
   a memory having stored therein signals for determining the frequency dividing ratio of the variable frequency divider and addressed in accordance with the count value of the address counter;
   means for setting in the variable frequency divider one of the frequency dividing ratio determining signals stored in the memory each time a certain number of output pulses are delivered from the variable frequency divider circuit;
   and means for setting the variable frequency dividing ratio at a fixed frequency dividing ratio other than unity in the period of the first integration.

2. The A-D converter according to claim 1, wherein the variable frequency divider circuit is a presettable counter and presets therein the frequency dividing ratio determining signal read out of the memory.

3. The A-D converter according to claim 1, wherein the variable frequency divider circuit comprises a binary counter, a plurality of selection gates capable of deriving therefrom pulses when a count value of the binary counter corresponds to a plurality of different predetermined values, and an OR gate for obtaining a logical sum of the outputs from the selection gates to provide a frequency divided output pulse, opening and closing of the selection gates being controlled by the frequency dividing ratio determining signal read out of the memory.

4. The A-D converter according to claim 1, wherein said source of input voltage comprises a thermocouple, said memory having a plurality of memory areas for storing frequency dividing ratio determining signals corresponding to different thermocouple conversion characteristics, and means for selecting between said plurality of memory areas.

5. The A-D converter according to claim 2 including means for switching the memory to provide a high impedance output or a low impedance output, a fixed frequency dividing ratio signal generator for generating a fixed frequency dividing ratio at all times, said generator being connected to the variable frequency divider circuit, and control means for switching the memory into the high impedance output state in the first integration period to cause the variable frequency divider circuit to serve as a fixed frequency divider circuit having a frequency dividing ratio determined by the fixed frequency dividing ratio signal, and for switching the memory into the low impedance output state in the second integration period to cause the frequency dividing ratio of the variable frequency divider circuit to be determined by the signal read out from the memory regardless of the fixed frequency dividing ratio signal.

* * * * *